US012805142B2

(12) United States Patent
Zhou et al.

(10) Patent No.: US 12,805,142 B2
(45) Date of Patent: Nov. 17, 2026

(54) DISPLAY PANEL, DESIGN METHOD OF DISPLAY PANEL, AND DISPLAY DEVICE

(71) Applicants: MIANYANG HKC OPTOELECTRONICS TECHNOLOGY CO., LTD., Mianyang (CN); HKC CORPORATION LIMITED, Shenzhen (CN)

(72) Inventors: Xiufeng Zhou, Mianyang (CN); Hailiang Wang, Mianyang (CN); Chen Chen, Mianyang (CN); Xin Yuan, Mianyang (CN); Baohong Kang, Mianyang (CN)

(73) Assignees: MIANYANG HKC OPTOELECTRONICS TECHNOLOGY CO., LTD., Mianyang (CN); HKC CORPORATION LIMITED, Shenzhen (CN)

( * ) Notice: Subject to any disclaimer, the term of this patent is extended or adjusted under 35 U.S.C. 154(b) by 336 days.

(21) Appl. No.: 18/639,190

(22) Filed: Apr. 18, 2024

(65) Prior Publication Data

US 2024/0357897 A1 Oct. 24, 2024

(30) Foreign Application Priority Data

Apr. 20, 2023 (CN) ........................ 202310427474.3

(51) Int. Cl.
*H10K 59/35* (2023.01)
*H10K 59/18* (2023.01)

(52) U.S. Cl.
CPC ........... *H10K 59/353* (2023.02); *H10K 59/18* (2023.02)

(58) Field of Classification Search
None
See application file for complete search history.

(56) References Cited

U.S. PATENT DOCUMENTS

2023/0276655 A1* 8/2023 Chen .................... H10K 59/879

FOREIGN PATENT DOCUMENTS

CN 108922964 A 11/2018
CN 110112200 A 8/2019
(Continued)

OTHER PUBLICATIONS

English translation of CN113299698 (Year: 2021).*
(Continued)

*Primary Examiner* — Bo B Jang
(74) *Attorney, Agent, or Firm* — HAUPTMAN HAM, LLP

(57) ABSTRACT

A display panel is provided. The display panel includes a display region and a non-display region. The display region has a first display region, a second display region, and a third display region, and the second display region and the third display region each have a display brightness greater than the first display region. Multiple pixel units are disposed in each of the first display region, the second display region, and the third display region, each of the plurality of pixel units in the second display region has an aperture ratio greater than each of the multiple pixel units in the first display region, and each of the multiple pixel units in the third display region has an aperture ratio greater than each of the multiple pixel units in the first display region. A design method of a display panel and a display device are also provided.

18 Claims, 5 Drawing Sheets

(56) References Cited

FOREIGN PATENT DOCUMENTS

| | | | | | |
|---|---|---|---|---|---|
| CN | 110416265 | A | | 11/2019 | |
| CN | 110676301 | A | | 1/2020 | |
| CN | 113299698 | A | | 8/2021 | |
| KR | 20210083546 | A | * | 7/2021 | ............ G09F 9/301 |

OTHER PUBLICATIONS

English translation of KR20210083546 (Year: 2021).*
The first office action issued in corresponding CN application No. 202310427474.3 dated May 15, 2024.
Notice of allowance issued in corresponding CN application No. 202310427474.3 dated Jun. 10, 2024.

* cited by examiner

DISPLAY PANEL, DESIGN METHOD OF DISPLAY PANEL, AND DISPLAY DEVICE

CROSS-REFERENCE TO RELATED APPLICATIONS

This application claims priority under 35 U.S.C. § 119 (a) to Chinese Patent Application No. 202310427474.3, filed Apr. 20, 2023, the entire disclosure of which is incorporated herein by reference.

TECHNICAL FIELD

This disclosure relates to the field of display technology, and in particular to a display panel, a design method of a display panel, and a display device.

BACKGROUND

An organic light-emitting diode (OLED) display device has advantages of no backlight, high contrast, fast response speed, high brightness, light weight, and simple manufacturing process, and is widely applied in the field of display technology.

However, as the size of the OLED display device increases, the luminance uniformity of a display region is getting worse, resulting in inconsistent service lives of different display regions, thereby causing uneven display (Mura) of the OLED display device, and affecting the viewing experience of a user.

Therefore, how to solve the problem in the existing technology that the service life of different display regions is inconsistent due to poor luminance uniformity of the OLED display device is an urgent problem to be solved.

SUMMARY

A display panel is provided in implementations of the disclosure. The display panel has a display region and a non-display region at least partially around the display region. The display region has a first display region, a second display region, and a third display region, the second display region and the third display region are at two opposite sides of the first display region, and the second display region and the third display region each have a display brightness greater than the first display region. Multiple pixel units are disposed in each of the first display region, the second display region, and the third display region, each of the multiple pixel units in the second display region has an aperture ratio greater than each of the multiple of pixel units in the first display region, and each of the multiple pixel units in the third display region has an aperture ratio greater than each of the multiple pixel units in the first display region.

Implementations of the present disclosure also provide a display device. The display device includes a driver module and the above display panel. The driver module is electrically connected to the display panel and is configured to output a scanning signal and a data signal to the display panel.

Implementations of the present disclosure also provide a design method of a display panel. The design method of the display panel is used for designing the above display panel. The design method of the display panel includes the following. A display panel to-be-tested is provided. The display panel to-be-tested is divided into multiple pixel unit sets, and luminous brightness of each pixel unit set is tested. The display panel to-be-tested is divided into multiple luminous regions according to luminous brightness of the multiple pixel unit sets, where each of the multiple luminous regions corresponds to a luminous brightness range, and luminous brightness ranges of the multiple luminous regions change in an increasing order or in a decreasing order. A luminous region with a luminous brightness range being a median is obtained among the multiple luminous regions. An aperture ratio of each of multiple pixel units in luminous regions with luminous brightness ranges greater than the median is increased, and an aperture ratio of each of the multiple pixel units in luminous regions with luminous brightness ranges less than the median is decreased.

BRIEF DESCRIPTION OF THE DRAWINGS

In order for clarity in elaboration of technical solutions of implementations of the disclosure, the following will give a brief introduction to accompanying drawings used for describing the implementations. Apparently, the accompanying drawings described below are some implementations of the disclosure. Based on these drawings, those of ordinary skill in the art can also obtain other drawings without creative effort.

DETAILED DESCRIPTION

Figure 1:
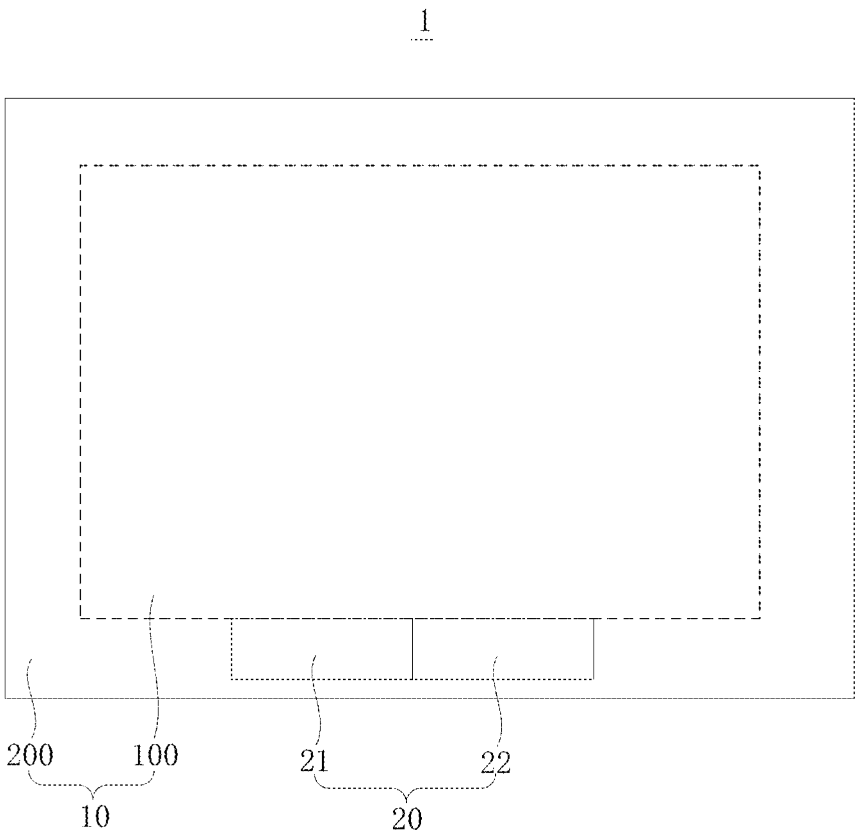
FIG. 1 is a schematic structural diagram of a display device provided in an implementation of the disclosure.

For better understanding, the present disclosure will be described in more details with reference to the drawings. Although the drawings illustrate the implementations of the present disclosure, the disclosure can be implemented in various manners and should not be limited to the implementations described herein. On the contrary, the implementations are provided to make the present disclosure more thorough and complete.

The following will describe implementations of the disclosure with reference to the accompanying drawings in the purpose of illustrate specific implementations of the disclosure. The numbering of components in this article, such as "first", "second", etc., is only used to distinguish the described objects and does not have any order or technical meaning. The terms "connect" and "link" mentioned in the present disclosure, include both direct and indirect connections (link) unless otherwise specified. The directional terms mentioned in the present disclosure, such as "up", "down", "front", "back", "left", "right", "inside", "outside", "side", etc., are only referring to the direction of the accompanying drawings. Therefore, the directional terms are only for the convenience of description and simplicity, rather than explicitly or implicitly indicate that apparatuses or components referred to herein must have a certain direction or be configured or operated in a certain direction and therefore cannot be understood as limitations to the disclosure.

In description of the present disclosure, it should be noted that, unless stated otherwise, terms "installing", "coupling", and "connecting" referred to herein should be understood in broader sense. For example, they may include a fixed coupling, a removable coupling, or an integrated coupling; they may include a mechanical coupling or an electrical coupling; they may include a direct coupling, an indirect coupling through a medium, or an interconnection between two components, or an interaction coupling between two components. For those of ordinary skill in the art, the above terms in the present disclosure can be understood according to specific situations. It is to be noted that the terms "first", "second", etc. in the specification, claims, and accompanying drawings of the present disclosure are used to distinguish different objects, rather than to describe a specific order. In addition, the terms "include", "may include", "comprise", or "may comprise" used in the present disclosure indicate the existence of the disclosed corresponding functions, operations, components, etc., and do not limit one or more other functions, operations, components, etc. In addition, the terms "include" or "comprise" indicate the existence of corresponding features, numbers, steps, operations, elements, components, or combinations thereof disclosed in the specification, and do not exclude the existence or addition of one or more other features, numbers, steps, operations, elements, components, or combinations thereof, in the purpose of covering non-exclusive inclusion. It is also to be understood that the meaning of "at least one" described in this article refers to one or more, such as one, two, or three, etc., while the meaning of "multiple" refers to at least two, such as two or three, etc., unless otherwise specified.

Unless otherwise defined, all the technical and scientific terms used in the present disclosure have the same meanings as commonly understood by those of skill in the art. The terms used herein in the disclosure are only for the purpose of describing implementations and are not intended to limit the present disclosure.

Reference is made to FIG. 1, which is a schematic structural diagram of a display device provided in an implementation of the disclosure. A display device 1 provided in an implementation of the disclosure may include a display panel 10 and a driver module 20, where the driver module 20 includes a scan driving circuit 21 and a data driving circuit 22, and the display panel 10 is connected to the scan driving circuit 21 and the data driving circuit 22 respectively. The scan driving circuit 21 is configured to output a scanning signal to the display panel 10, and the data driving circuit 22 is configured to output a data signal to the display panel 10. The driver module 20 may be an integrated circuit (IC) chip.

In implementations of the disclosure, the display device 1 may be an organic light-emitting diode (OLED) display device.

It is to be understood that the display device 1 may be used for electronic devices including but not limited to TV, a tablet computer, a notebook computer, a desktop computer, a mobile phone, a vehicle mounted display, a smart watch, a smart bracelet, smart glasses, etc. According to implementations of the disclosure, a specific type of the display device 1 is not subject to special restrictions. Those of skill in the art may design accordingly based on the specific usage requirements of the display device 1, which will not be elaborated here.

In some implementations of the disclosure, the display device 1 may also include other necessary components and parts such as a power board, a high-voltage board, and a button control board. Those of skill in the art may supplement accordingly based on the specific type and an actual function of the display device 1, which will not be elaborated here.

Referring to FIG. 1, in implementations of the disclosure, the display panel 10 also has a display region 100 and a non-display region 200, and the non-display region 200 is at least partially around the display region 100. The display region 100 is configured for image display, and the non-display region 200 is configured for arrangement of the driver module 20 to control the display region 100 for image display.

Figure 2:
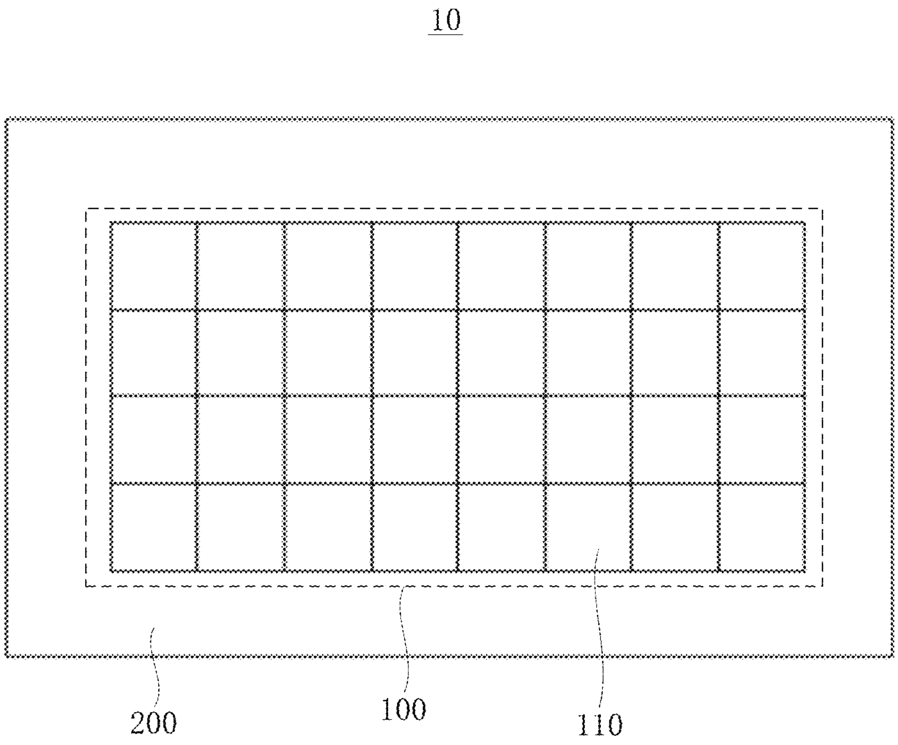
FIG. 2 is a schematic planar structural diagram of the display panel illustrated in FIG. 1.

Reference is made to FIG. 2, which is a schematic planar structural diagram of the planar structure of the display panel illustrated in FIG. 1. In implementations of the disclosure, the display region 100 includes multiple pixel units 110 arranged in an array. The pixel units 110 are configured to display images of different colors and brightness.

Figure 3:
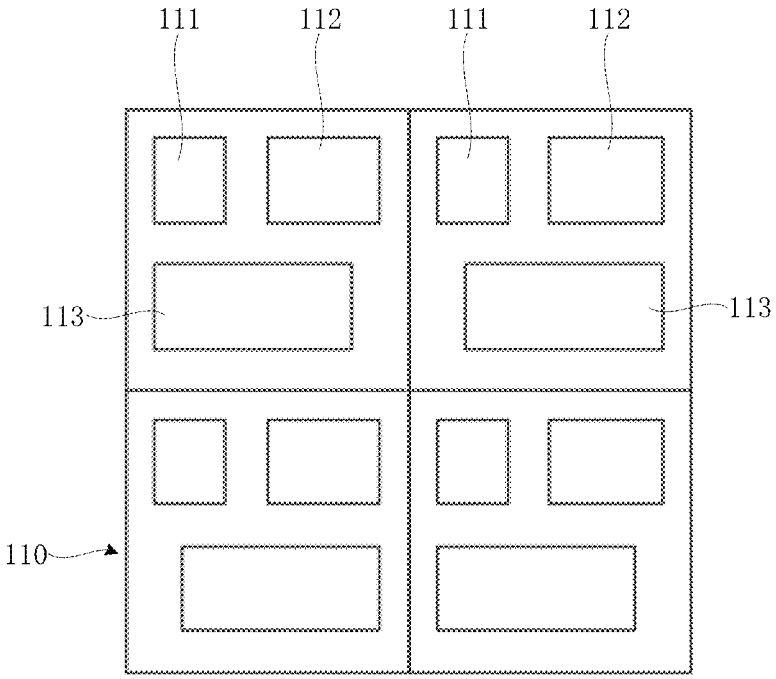
FIG. 3 is a schematic structural diagram of a pixel of the display panel illustrated in FIG. 2.

Reference is further made to FIG. 3, which is a schematic structural diagram of a pixel of the display panel illustrated in FIG. 2. In implementations of the disclosure, each of pixel units 110 includes a first sub-pixel 111, a second sub-pixel 112, and a third sub-pixel 113. The first sub-pixel 111 is configured to emit a first color light, the second sub-pixel 112 is configured to emit a second color light, and the third sub-pixel 113 is configured to emit a third color light.

In some implementations of the disclosure, the first color light may be red light, the second color light may be green light, and the third color light may be blue light.

Correspondingly, arrangement of the first sub-pixel 111, the second sub-pixel 112, and the third sub-pixel 113 may be standard red-green-blue (RGB) arrangement, RGB Pentile arrangement, or RGB Delta arrangement, which is not limited specifically in the present disclosure.

Figure 4:
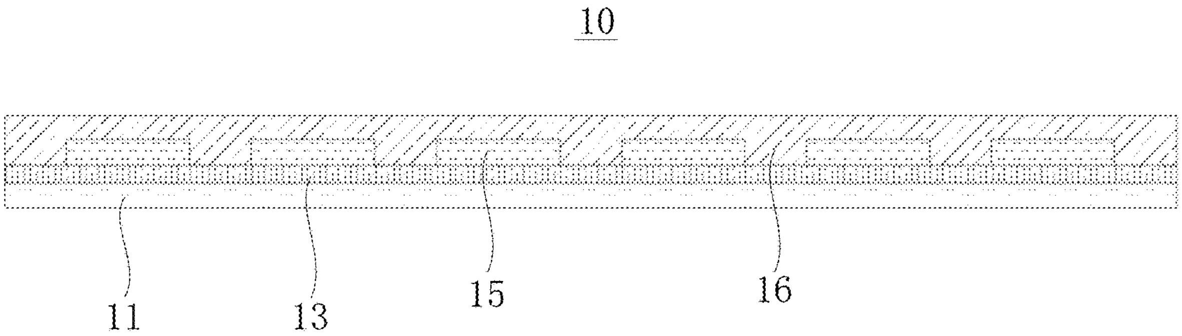
FIG. 4 is a schematic layered structural diagram of the display panel illustrated in FIG. 2.

Reference is made to FIG. 4, which is a schematic layered structural diagram of the display panel illustrated in FIG. 2. The display panel 10 provided in the present disclosure may include a substrate 11, a circuit layer 13, multiple light-emitting elements 15, and a packaging layer 16. The circuit layer 13 is arranged on one side of the substrate 11, and the multiple light-emitting elements 15 are arranged in an array on the other side of the substrate 11 facing away from the circuit layer 13. The packaging layer 16 covers the multiple light-emitting elements 15 on the circuit layer 13. The circuit layer 13 is electrically connected to the multiple light-emitting elements 15 to drive the multiple light-emitting elements 15 to emit light, and the packaging layer 16 is configured to protect the multiple light-emitting elements 15.

In some implementations of the disclosure, the first sub-pixel 111, the second sub-pixel 112, and the third sub-pixel 113 each correspond to one of the light-emitting elements 15. That is to say, the multiple light-emitting elements 15 include multiple first light-emitting elements, multiple second light-emitting elements, and multiple third light-emitting elements. The first light-emitting element corresponds to the first sub-pixel 111, the second light-emitting element corresponds to the second sub-pixel 112, and the third light-emitting element corresponds to the third sub-pixel 113. The first light-emitting element may emit red light, causing the first sub-pixel 111 to emit red light, the second light-emitting element may emit green light, causing the second sub-pixel 112 to emit green light, and the third light-emitting element may emit blue light, causing the third sub-pixel 113 to emit blue light.

Figure 5:
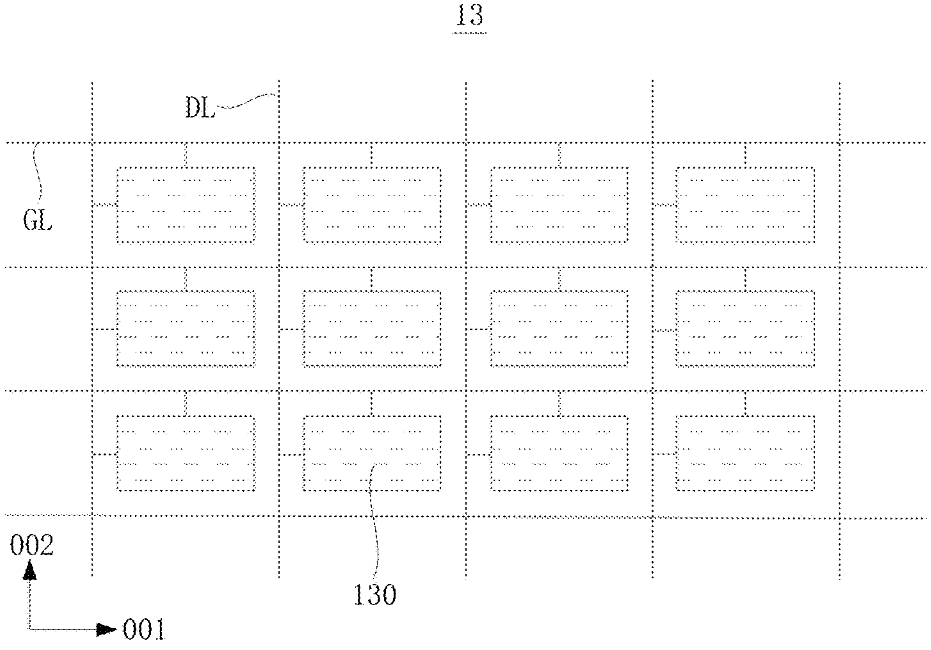
FIG. 5 is a schematic diagram illustrating a circuit connection of the display panel illustrated in FIG. 2.

In implementations of the disclosure, reference is made to FIG. 5, which is a schematic diagram illustrating a circuit connection of the display panel illustrated in FIG. 2. The circuit layer 13 includes multiple scanning lines GL, multiple data lines DL, and multiple pixel driving circuits 130. The multiple scanning lines GL each extend in the first direction 001 and are arranged in parallel at intervals in the second direction 002 perpendicular to the first direction 001. The multiple data lines DL each extend in the second direction 002 and are arranged in parallel at intervals in the first direction 001. The pixel driving circuit 130 is arranged between two adjacent scanning lines GL and between two adjacent data lines DL. The pixel driving circuit 130 is electrically connected to the scanning line GL and the data line DL, respectively. The scanning line GL is also electrically connected to a scanning driving circuit 21, and the data line DL is also electrically connected to a data driving circuit 22. A scanning signal output by the scanning driving circuit 21 is transmitted to the pixel driving circuit 130 through the scanning line GL, and a data signal output by the data driving circuit 22 is transmitted to the pixel driving circuit 130 through the data line DL. The pixel driving circuit 130 drives the light-emitting element 15 to emit light according to the data signal.

In some implementations of the disclosure, the pixel driving circuit 130 may control emission of the light-emitting element 15 in a manner of active matrix (AM). The AM refers to that the pixel driving circuit 130 is at least equipped, for the light-emitting element 15, with a thin-film transistor (TFT) with a switching function and a capacitor for storing charge.

Referring to FIG. 5, the scanning signal enters the scanning line GL from the left and right sides of the display region 100 illustrated in FIG. 5. Due to the certain electric resistance of the scanning line GL itself, as the transmission distance of the scanning signal on the scanning line GL increases, the electric potential of the scanning signal decreases, causing the electric potential of the scanning signal on the left and right parts of the scanning line GL to be greater than the electric potential of the scanning signal on the middle part of the scanning line GL. As a result, the display brightness of the left and right parts of the display region 100 is greater than the display brightness of the middle part of the display region 100. The left and right sides refer to the two sides where the scanning signal enters the display region 100. In other implementations, the scanning signal can also enter the scanning line GL from one side of the display region 100, that is, from one side to the opposite side, the display brightness of the display region 100 gradually decreases.

Figure 6:
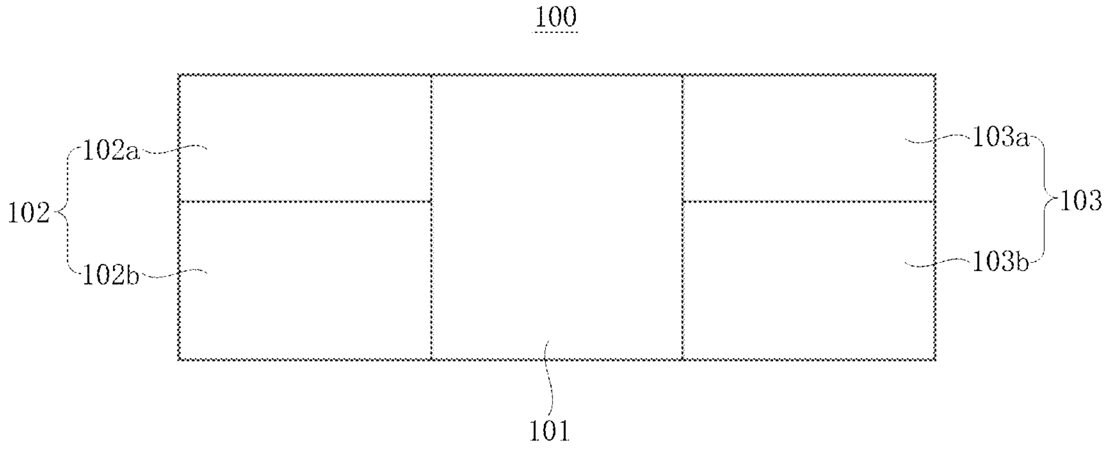
FIG. 6 is a schematic planar structural diagram of a display region in the display panel illustrated in FIG. 2.

Reference is made to FIG. 6, which is a schematic planar structural diagram of the display region in the display panel illustrated in FIG. 2. The display region 100 includes a first display region 101, a second display region 102, and a third display region 103. The second display region 102 and the third display region 103 are respectively arranged on opposite sides of the first display region 101. That is to say, the second display region 102 is arranged on one side of the first display region 101, and the third display region 103 is set on one other side of the first display region 101 facing away from the second display region 102.

In some implementations of the disclosure, the scanning signal enters the scanning line GL from one side of the second display region 102 facing away from the first display region 101 and one side of the third display region 103 facing away from the first display region 101. Due to the certain electric resistance of the scanning line GL itself, as the transmission distance of the scanning signal on the scanning line GL increases, the electric potential of the scanning signal decreases, causing the display brightness of the second display region 102 greater than the display brightness of the first display region 101, and causing the display brightness of the third display region 103 greater than the display brightness of the first display region 101.

In implementations of the disclosure, multiple pixel units 110 are disposed in the first display region 101, the second display region 102, and the third display region 103. The pixel units 110 located in the second display region 102 has an aperture ratio greater than the pixel units 110 located in the first display region 101. The pixel units 110 located in the third display region 103 has an aperture ratio greater than the pixel units 110 located in the first display region 101. The aperture ratio of the pixel unit 110 refers to the ratio of the area of part of the pixel unit 110 that emits light to the overall area of the pixel unit 110.

It is to be understood that, the service life of the light-emitting element 15 is inversely proportional to its luminous brightness, that is, the service life of the pixel unit 110 is inversely proportional to its luminous brightness. The higher the luminous brightness of the pixel unit 110, the shorter the service life of the pixel unit 110. Increasing the aperture ratio of the pixel unit 110 helps to improve the service life of the pixel unit 110, and the aperture ratio of the pixel unit 110 does not affect the luminous brightness of the pixel unit 110. Therefore, the technical solution of the present disclosure is to increase the aperture ratio of the pixel unit 110 in the display region with higher display brightness, thereby improving the service life of the pixel unit 110 in the display region with higher display brightness. In this way, the service life of the pixel unit 110 in different display regions tends to be consistent, thereby achieving long-term stable display of the display panel 10 and improving product competitiveness.

In some implementations of the disclosure, the first sub-pixel 111 located in the second display region 102 has an aperture ratio greater than the first sub-pixel 111 located in the first display region 101. The second sub-pixel 112 located in the second display region 102 has an aperture ratio greater than the second sub-pixel 112 located in the first display region 101. The third sub-pixel 113 located in the second display region 102 has an aperture ratio greater than the third sub-pixel 113 located in the first display region 101.

In some implementations of the disclosure, the first sub-pixel 111 located in the third display region 103 has an aperture ratio greater than the first sub-pixel 111 located in the first display region 101. The second sub-pixel 112 located in the third display region 103 has an aperture ratio greater than the second sub-pixel 112 located in the first display region 101. The third sub-pixel 113 located in the third display region 103 has an aperture ratio greater than the third sub-pixel 113 located in the first display region 101.

It is to be understood that, the aperture ratio of the sub-pixel refers to that the ratio of the area of part of the sub-pixel that emits light to the overall area of the sub-pixel. The aperture ratio of the pixel unit 110 is the sum of the aperture ratio of the first sub-pixel 111, the aperture ratio of the second sub-pixel 112, and the aperture ratio of the third sub-pixel 113.

In summary, for the display panel 10 provided in implementations of the disclosure, the pixel units 110 located in the second display region 102 each have an aperture ratio greater than the pixel units 110 located in the first display region 101, and the pixel units 110 located in the third display region 103 each have an aperture ratio greater than the pixel units 110 located in the first display region 101. That is, the aperture ratio of each of the pixel units 110 in the first display region 101 is set to be lower than the aperture ratio of each of the pixel units 110 in the second display region 102 and the third display region 103 located in opposite sides of the first display region 101. In this way, the service life of the pixel units 110 in the second display region 102 and the pixel units 110 in the third display region 103 are increased. The service life of the pixel units 110 in different display regions tends to be consistent, thereby achieving long-term stable display of the display panel 10 and improving product competitiveness. Moreover, the technical solution of the present disclosure is compatible with existing process routes and materials, without adding additional costs.

Referring to FIG. 5, the data signal enters the data line DL from the lower side of the display region 100. Due to the certain electric resistance of the data line DL itself, as the transmission distance of the data signal on the data line DL increases, the electric potential of the data signal decreases, causing the display brightness in the lower part of the display region 100 greater than the display brightness in the upper part. The lower side refers to the side where the data signal enters the display region 100, and the upper side refers to the side opposite the upper side.

In implementations of the disclosure, referring to FIG. 6, the second display region 102 includes a first display sub-region 102*a* and a second display sub-region 102*b* adjacent to the first display sub-region 102*a*, and both the first display sub-region 102*a* and the second display sub-region 102*b* are connected to the same side of the first display region 101 opposite the third display region 103. The data signal enters the data line DL from one side of the second display sub-region 102*b* facing away from the first display sub-region 102*a*, causing that the display brightness of the second display sub-region 102*b* is greater than the display brightness of the first display sub-region 102*a*. The pixel unit 110 located in the second display sub-region 102*b* has an aperture ratio greater than the pixel unit 110 located in the first display sub-region 102*a*.

Furthermore, the first sub-pixel 111 located in the second display sub-region 102*b* has an aperture ratio greater than the first sub-pixel 111 located in the first display sub-region 102*a*. The second sub-pixel 112 located in the second display sub-region 102*b* has an aperture ratio greater than the second sub-pixel 112 located in the first display sub-region 102*a*. The third sub-pixel 113 located in the second display sub-region 102*b* has an aperture ratio greater than the third sub-pixel 113 located in the first display sub-region 102*a*.

In implementations of the disclosure, referring to FIG. 6, the third display region 103 includes a third display sub-region 103*a* and a fourth display sub-region 103*b* adjacent to the third display sub-region 103*a*, and both the third display sub-region 103*a* and the fourth display sub-region 103*b* are connected to the same side of the first display region 101 facing away from the second display region 102. That is, the third display sub-region 103*a* is disposed on one side of the first display region 101 facing away from the first display sub-region 102*a*, and the fourth display sub-region 103*b* is disposed on said one side of the first display region 101 facing away from the second display sub-region 102*b*. The data signal enters the data line DL from one side of the fourth display sub-region 103*b* facing away from the third display sub-region 103*a*, causing that the display brightness of the third display sub-region 103*b* is greater than the display brightness of the third display sub-region 103*a*. The pixel unit 110 located in the fourth display sub-region 103*b* has an aperture ratio greater than the pixel unit 110 located in the third display sub-region 103*a*.

Furthermore, the first sub-pixel 111 located in the fourth display sub-region 103*b* has an aperture ratio greater than the first sub-pixel 111 located in the third display sub-region 103*a*. The second sub-pixel 112 located in the fourth display sub-region 103*b* has an aperture ratio greater than the second sub-pixel 112 located in the third display sub-region 103*a*. The third sub-pixel 113 located in the fourth display sub-region 103*b* has an aperture ratio greater than the third sub-pixel 113 located in the third display sub-region 103*a*.

In some implementations of the disclosure, the electric potential of the data signal varies less in the first display region 101, which has a smaller impact on the luminous brightness of the first display region 101. Therefore, the change of the aperture ratio of the pixel unit 110 in the first display region 101 is not further limited.

In the related art, the light-emitting element 15 is mainly produced through the process of evaporated coatings. In this way, multiple light-emitting elements 15 are sequentially formed from one side of the display region 100 to the opposite side of the display region 100. In implementations of the disclosure, the multiple light-emitting elements 15 are sequentially formed from a direction of the second display region 102 to the third display region 103 (from the left to the right of the display region 100), that is, the multiple light-emitting elements 15 in the second display region 102 are first formed, then multiple light-emitting elements 15 in the first display region 101 are formed, and finally multiple light-emitting elements 15 in the third display region 103 are formed. The process of evaporated coatings will cause the film of the first formed light-emitting element 15 to be thicker than the film of the later formed light-emitting element 15, thus causing the display brightness of the second display region 102 to be greater than the display brightness of the third display region 103. As such, the service life of the pixel unit 110 in the second display region 102 is shorter than the service life of the pixel unit 110 in the third display region 103. In other implementations of the disclosure, the multiple light-emitting elements 15 can also be formed sequentially from the right side to the left side of the display region 100, from the upper side to the lower side of the display region 100, or from the lower side to the upper side of the display region 100, which is not limited in the disclosure.

In implementations of the disclosure, the pixel unit 110 located in the second display region 102 has an aperture ratio greater than the pixel unit 110 located in the third display region 103. Furthermore, the pixel unit 110 located in the first display sub-region 102*a* has an aperture ratio greater than the pixel unit 110 located in the fourth display sub-region 103*b*.

Furthermore, the first sub-pixel 111 located in the first display sub-region 102*a* has an aperture ratio greater than the first sub-pixel 111 located in the fourth display sub-region 103*b*. The second sub-pixel 112 located in the first display sub-region 102*a* has an aperture ratio greater than the second sub-pixel 112 located in the fourth display sub-region 103*b*. The third sub-pixel 113 located in the first display sub-region 102*a* has an aperture ratio greater than the third sub-pixel 113 located in the fourth display sub-region 103*b*.

In the implementations of the disclosure, the aperture ratio of the pixel unit 110 in the first display region 101 ranges from 37% to 47%, for example, 37%, 39%, 42%, 44%, 45%, 47%, or others, which is not limited in the disclosure.

In some implementations of the disclosure, the aperture ratio of the pixel unit 110 in the first display sub-region 102*a* ranges from 43% to 53%, for example, 43%, 46%, 47%, 48%, 50%, 53%, or others, which is not limited in the disclosure.

In some implementations of the disclosure, the aperture ratio of the pixel unit 110 in the second display sub-region 102*b* ranges from 45% to 55%, for example, 45%, 49%, 50%, 51%, 54%, 55%, or others, which is not limited in the disclosure.

In some implementations of the disclosure, the aperture ratio of the pixel unit 110 in the third display sub-region 103*a* ranges from 39% to 49%, for example, 39%, 40%, 43%, 44%, 47%, 48%, 49%, or others, which is not limited in the disclosure.

In some implementations of the disclosure, the aperture ratio of the pixel unit 110 in the fourth display sub-region 103*b* ranges from 41% to 51%, for example, 41%, 45%, 46%, 47%, 49%, 50%, 51%, or others, which is not limited in the disclosure.

In some implementations of the disclosure, the ratio of the aperture ratio of the first sub-pixel 111 in the display region 100 to the aperture ratio of the second sub-pixel 112 in the display region 100 ranges from 1:1.6 to 1:1.4, for example, 1:1.6, 1:1.52, 1:1.45, 1:1.4, or others, which is not limited in the disclosure.

In some implementations of the disclosure, the ratio of the aperture ratio of the first sub-pixel 111 in the display region 100 to the aperture ratio of the third sub-pixel 113 in the display region 100 ranges from 1:2.5 to 1:2, for example, 1:2.5, 1:2.4, 1:2.3, 1:2.2, 1:2.1, 1:2, or others, which is not limited in the disclosure.

In summary, the display device 1 provided in implementations of the disclosure includes the display panel 10, and for the display panel 10, the pixel units 110 located in the second display region 102 has an aperture ratio greater than the pixel units 110 located in the first display region 101, and the pixel units 110 located in the third display region 103 has an aperture ratio greater than the pixel units 110 located in the first display region 101. In this way, the service life of the pixel units 110 in the second display region 102 and the pixel units 110 in the third display region 103 are increased. The service life of the pixel units 110 in different display regions tends to be consistent, thereby achieving long-term stable display of the display panel 10 and improving product competitiveness. Moreover, the technical solution of the present disclosure is compatible with existing process routes and materials, without adding additional costs.

Figure 7:
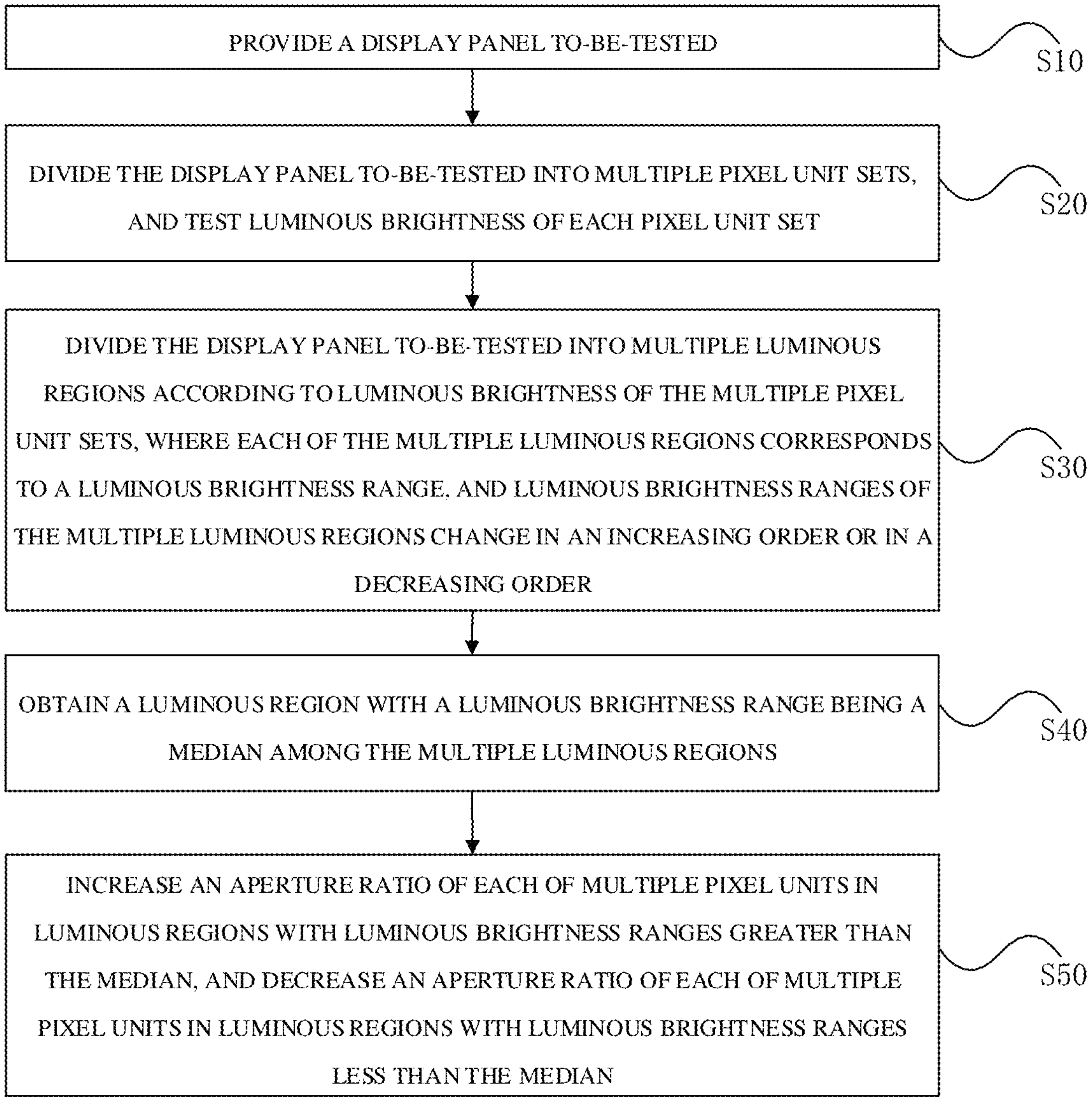
FIG. 7 is a schematic flowchart of a design method of a display panel provided in an implementation of the disclosure.

Based on the same inventive concept, implementations of the disclosure also provide a design method of a display panel. The design method is used for designing the display panels illustrated in FIG. 1 to FIG. 6. For the same description of the design method between the display panel and the display panel 10, reference can be made to the relevant description of the display panel 10, which will not be repeated here. Reference is made to FIG. 7, which is a flowchart of the design method of the display panel disclosed in the present disclosure. The design method of the display panel may include the following operations.

At 10, a display panel to-be-tested is provided.

Specifically, a display panel to-be-tested is provided, and the display panel to-be-tested can perform normal screen display.

At 20, the display panel to-be-tested is divided into multiple pixel unit sets, and luminous brightness of each pixel unit set is tested.

Specifically, the display panel to-be-tested is divided into the multiple pixel unit sets the multiple pixel unit sets are arranged in an array, and each pixel unit set includes multiple pixel units 110.

In some implementations of the disclosure, the display panel to-be-tested may be evenly divided into 100 to 10000 pixel unit sets, for example, 100, 1000, 5000, 6000, 9000, 10000, or others, which is not limited in the disclosure.

In some implementations of the disclosure, in order to test the brightness of each pixel unit set, the brightness of the pixel unit 110 in each pixel unit set may be tested, and the average brightness of multiple pixel units 110 may be calculated to obtain the brightness of the pixel unit set, or the median brightness of multiple pixel units 110 can be calculated to obtain the luminous brightness of the pixel unit set, which is not limited in the disclosure.

At 30, the display panel to-be-tested is divided into multiple luminous regions according to luminous brightness of the multiple pixel unit sets, where each of the multiple luminous regions corresponds to a luminous brightness range, and luminous brightness ranges of the multiple luminous regions change in an increasing order or in a decreasing order.

Specifically, the display panel to-be-tested is divided into the multiple luminous regions according to the luminous brightness of the multiple pixel unit sets according to a formula:

$$N=\left((Lum_{max}-Lum_{min})/Lum_{max}\times 100\%\right)/a\ \%$$

where N is a number of luminous regions, $Lum_{max}$ is a maximum luminous brightness in the multiple pixel unit sets, $Lum_{min}$ is a minimum luminous brightness in the multiple pixel unit sets, and a is 1, 2, 3, 4, 5, 6, 7, 8, 9, and 10.

In some implementations of the disclosure, when $((Lum_{max}-Lum_{min})/Lum_{max}\times 100\%)$ is greater than 0% and less than or equal to 10%, a may be 1, 2, or 3; when $((Lum_{max}-Lum_{min})/Lum_{max}\times 100\%)$ is greater than 10% and less than or equal to 25%, a may be 4, 5, 6, or 7; and when $((Lum_{max}-Lum_{min})/Lum_{max}\times 100\%)$ is greater than 25%, a may be 8, 9, or 10. It is to be understood that a is used to limit N. When a gets smaller, N gets greater, which means more luminous regions; and when a gets greater, N gets smaller, which means less luminous regions. It is to be understood that a may be determined according to the design difficulty. Greater a will lead to smaller N, which means less luminous regions and less design difficulty.

In some implementations of the disclosure, N may be obtained by rounding, and N is an odd number.

In some implementations of the disclosure, the number of luminous regions may be from 5 to 100, for example, 5, 20, 50, 70, 90, 100, or others, which is not limited in the disclosure.

At 40, a luminous region with a luminous brightness range being a median is obtained among the multiple luminous regions.

Specifically, since Nis an odd number, i.e., the number of the luminous regions is an odd number, that is, luminous brightness ranges of the multiple luminous regions have a luminous brightness range.

At 50, an aperture ratio of each of multiple pixel units in the luminous regions with luminous brightness ranges greater than the median is increased, and an aperture ratio of each of multiple pixel units in luminous regions with luminous brightness ranges less than the median is decreased.

Specifically, the aperture ratio of each of the multiple pixel units in the luminous region with luminous brightness ranges greater than the median is increased, for example, an aperture ratio of a luminous region with a brightness range greater than the median by one gradient is increased by h %, and the aperture ratio of a luminous region with a luminous brightness range greater than the median by two gradients is increased by 2 h %. The aperture ratio of each of the multiple pixel units in the luminous region with luminous brightness ranges less than the median, for example, an aperture ratio of a luminous region with a luminous brightness range greater than the median by one gradient is decreased by h %, and an aperture ratio of a luminous region with a luminous brightness range less than the median by two gradients is decreased by 2 h %, where h=1, 2, 3, 4, and 5. When N is 1, 2, and 3, h is 4 and 5; when N is 4, 5, and 6, h is 2 and 3; and when N is greater than 6, h is 1.

It is to be understood that, for example, the display panel to-be-tested is divided into a first luminous region, a second luminous region, a third luminous region, a fourth luminous region, and a fifth luminous region with increasing brightness in sequence. The maximum brightness difference between multiple luminous regions is 25%. That is, the luminous brightness range of the third luminous region is the median, the luminous brightness range of the second luminous region is less than the luminous brightness range of the third luminous region by one gradient, the luminous brightness range of the first luminous region is less than the luminous brightness range of the third luminous region by two gradients, and the luminous brightness range of the fourth luminous region is greater than the luminous brightness range of the third luminous region by one gradient, the luminous brightness range of the fifth luminous region is greater than the luminous brightness range of the third luminous region by two gradients. In this case, decrease the aperture ratio of the first luminous region by 2 h %, decrease the aperture ratio of the second luminous region by h %, increase the aperture ratio of the fourth luminous region by h %, and increase the aperture ratio of the fifth luminous region by 2 h %.

It is also to be understood that h decreases with the increase of N. The larger the N, the more divided luminous regions, and the smaller the change in the luminous brightness range of different luminous regions. Therefore, the designed change in the aperture ratio of the luminous regions is correspondingly less.

In summary, the design method of the display panel provided in the present disclosure includes the following. The display panel to-be-tested is provided, the display panel to-be-tested is divided into multiple pixel unit sets, and the luminous brightness of each pixel unit set is tested. The display panel to-be-tested is divided into multiple luminous regions according to the luminous brightness of multiple pixel unit sets, where each luminous region corresponds to a luminous brightness range, and the luminous brightness ranges of the multiple luminous regions change sequentially. The luminous region with a luminous brightness range being a median is obtained among the multiple luminous regions. The aperture ratio of each of the multiple pixel units in the luminous regions with luminous brightness ranges greater than the median is increased, and the aperture ratio of each of the multiple pixel units in the luminous regions with luminous brightness ranges less than the median is decreased. Therefore, by increasing the aperture ratio of each of the multiple pixel units in the luminous regions with luminous brightness ranges greater than the median and decreasing the aperture ratio of each of the multiple pixel units in the luminous regions with luminous brightness ranges less than the median, the service life of the pixel units 110 in different luminous regions tend to be consistent, thereby achieving long-term stable display of the display panel 10 and improving product competitiveness.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations.

It is to be understood that the disclosure is not limited to the disclosed implementations. Those of ordinary skill in the art can make improvements or changes based on the above description, and all these improvements and changes should fall within the protection scope of the appended claims of this disclosure. Those of ordinary skill in the art may understand and implement the entire or partial process of the above disclosure, and the equivalent changes made in accordance with the claims of this disclosure still fall within the scope of this disclosure.

What is claimed is:

1. A display panel having a display region and a non-display region at least partially around the display region, the display region having a first display region, a second display region, and a third display region, the second display region and the third display region being at two opposite sides of the first display region, and the second display region and the third display region each having a display brightness greater than the first display region, wherein, a plurality of pixel units are disposed in each of the first display region, the second display region, and the third display region, each of the plurality of pixel units in the second display region has an aperture ratio greater than each of the of the plurality of pixel units in the first display region, and each of the plurality of pixel units in the third display region has an aperture ratio greater than each of the plurality of pixel units in the first display region;

wherein the second display region has a first display sub-region and a second display sub-region adjacent to the first display sub-region, and the second display sub-region has display brightness greater than the first display sub-region; and wherein each of a plurality of pixel units in the second display sub-region has an aperture ratio greater than each of a plurality of pixel units in the first display sub-region.

2. The display panel of claim 1, wherein each of the plurality of pixel units comprises a first sub-pixel, a second sub-pixel, and a third sub-pixel, the first sub-pixel in the second display region has an aperture ratio greater than the first sub-pixel in the first display region, the second sub-pixel in the second display region has an aperture ratio greater than the second sub-pixel in the first display region, and the third sub-pixel in the second display region has an aperture ratio greater than the third sub-pixel located in the first display region.

3. The display panel of claim 2, wherein the first sub-pixel in the third display region has an aperture ratio greater than the first sub-pixel in the first display region, the second sub-pixel in the third display region has an aperture ratio greater than the second sub-pixel in the first display region, and the third sub-pixel in the third display region has an aperture ratio greater than the third sub-pixel located in the first display region.

4. The display panel of claim 1, wherein the aperture ratio of each of the plurality of pixel units in the first display sub-region ranges from 43% to 53%, and the aperture ratio of each of the plurality of pixel units in the second display sub-region ranges from 45% to 55%.

5. The display panel of claim 1, wherein the third display region has a third display sub-region and a fourth display sub-region adjacent to the third display sub-region, and the fourth display sub-region has display brightness greater than the third display sub-region; and each of a plurality of pixel units in the fourth display sub-region has an aperture ratio greater than each of a plurality of pixel units in the third display sub-region.

6. The display panel of claim 5, wherein the aperture ratio of each of the plurality of pixel units in the third display sub-region ranges from 39% to 49%, and the aperture ratio of each of the plurality of pixel units in the fourth display sub-region ranges from 41% to 51%.

7. The display panel of claim 1, wherein the second display region has display brightness greater than the third display region, each of the plurality of pixel units in the second display region has an aperture ratio greater than each of the plurality of pixel units in the third display region.

8. The display panel of claim 1, wherein the aperture ratio of each of the plurality of pixel units in the first display region ranges from 37% to 47%.

9. A display device, comprising:

a display panel; and a driver module electrically connected to the display panel and configured to output a scanning signal and a data signal to the display panel; wherein, the display panel has a display region and a non-display region at least partially around the display region, the display region has a first display region, a second display region, and a third display region, the second display region and the third display region are at two opposite sides of the first display region, and the second display region and the third display region each have a display brightness greater than the first display region; and a plurality of pixel units are disposed in each of the first display region, the second display region, and the third display region, each of the plurality of pixel units in the second display region has an aperture ratio greater than each of the plurality of pixel units in the first display region, and each of the plurality of pixel units in the third display region has an aperture ratio greater than each of the plurality of pixel units in the first display region;

wherein the second display region has a first display sub-region and a second display sub-region adjacent to the first display sub-region, and the second display sub-region has display brightness greater than the first display sub-region; and wherein each of a plurality of pixel units in the second display sub-region has an aperture ratio greater than each of a plurality of pixel units in the first display sub-region.

10. The display device of claim 9, wherein each of the plurality of pixel units comprises a first sub-pixel, a second sub-pixel, and a third sub-pixel, the first sub-pixel in the second display region has an aperture ratio greater than the first sub-pixel in the first display region, the second sub-pixel in the second display region has an aperture ratio greater than the second sub-pixel in the first display region, and the third sub-pixel in the second display region has an aperture ratio greater than the third sub-pixel located in the first display region.

11. The display device of claim 10, wherein the first sub-pixel in the third display region has an aperture ratio greater than the first sub-pixel in the first display region, the second sub-pixel in the third display region has an aperture ratio greater than the second sub-pixel in the first display region, and the third sub-pixel in the third display region has an aperture ratio greater than the third sub-pixel located in the first display region.

12. The display device of claim 9, wherein the aperture ratio of each of the plurality of pixel units in the first display sub-region ranges from 43% to 53%, and the aperture ratio of each of the plurality of pixel units in the second display sub-region ranges from 45% to 55%.

13. The display device of claim 9, wherein the third display region has a third display sub-region and a fourth display sub-region adjacent to the third display sub-region, and the fourth display sub-region has display brightness greater than the third display sub-region; and each of a plurality of pixel units in the fourth display sub-region has an aperture ratio greater than each of a plurality of pixel units in the third display sub-region.

14. The display device of claim 13, wherein the aperture ratio of each of the plurality of pixel units in the third display sub-region ranges from 39% to 49%, and the aperture ratio of each of the plurality of pixel units in the fourth display sub-region ranges from 41% to 51%.

15. The display device of claim 9, wherein the second display region has display brightness greater than the third display region, each of the plurality of pixel units in the second display region has an aperture ratio greater than each of the plurality of pixel units in the third display region.

16. The display device of claim 9, wherein the aperture ratio of each of the plurality of pixel units in the first display region ranges from 37% to 47%.

17. A design method of a display panel, used for designing a display panel and comprising:

providing a display panel to-be-tested;

dividing the display panel to-be-tested into a plurality of pixel unit sets, and testing luminous brightness of each pixel unit set;

dividing the display panel to-be-tested into a plurality of luminous regions according to luminous brightness of the plurality of pixel unit sets, wherein each of the plurality of luminous regions corresponds to a luminous brightness range, and luminous brightness ranges of the plurality of luminous regions change in an increasing order or in a decreasing order;

obtaining a luminous region with a luminous brightness range being a median among the plurality of luminous regions; and increasing an aperture ratio of each of a plurality of pixel units in luminous regions with luminous brightness ranges greater than the median, and decreasing an aperture ratio of each of a plurality of pixel units in luminous regions with luminous brightness ranges less than the median.

18. The design method of a display panel of claim 17, wherein the display panel to-be-tested is divided into the plurality of luminous regions according to the luminous brightness of the plurality of pixel unit sets according to a formula:

$$N=((Lum_{max}-Lum_{min})/Lum_{max}\times 100\%)/a\ \%$$

wherein N is a number of luminous regions, $Lum_{max}$ is a maximum luminous brightness in the plurality of pixel unit sets, $Lum_{min}$ is a minimum luminous brightness in the plurality of pixel unit sets, and a is 1, 2, 3, 4, 5, 6, 7, 8, 9, and 10.

* * * * *